US009413295B1

(12) United States Patent
Chang

(10) Patent No.: US 9,413,295 B1
(45) Date of Patent: Aug. 9, 2016

(54) SYSTEMS AND METHODS OF PHASE FREQUENCY DETECTION WITH CLOCK EDGE OVERRIDING RESET, EXTENDING DETECTION RANGE, IMPROVEMENT OF CYCLE SLIPPING AND/OR OTHER FEATURES

(71) Applicant: GSI TECHNOLOGY, INC., Sunnyvale, CA (US)

(72) Inventor: Chao-Hung Chang, Gilroy, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

(21) Appl. No.: 14/217,221

(22) Filed: Mar. 17, 2014

Related U.S. Application Data

(60) Provisional application No. 61/801,159, filed on Mar. 15, 2013.

(51) Int. Cl.
*G01R 25/00* (2006.01)
*H03D 13/00* (2006.01)
(52) U.S. Cl.
CPC .................. *H03D 13/004* (2013.01)
(58) Field of Classification Search
USPC .................. 327/3, 5, 7, 12, 39, 40, 43, 47, 49
See application file for complete search history.

(56) References Cited

U.S. PATENT DOCUMENTS

| | | | |
|---|---|---|---|
| 5,661,419 A * | 8/1997 | Bhagwan | 327/8 |
| 5,736,872 A | 4/1998 | Sharma et al. | |
| 5,963,059 A | 10/1999 | Partovi et al. | |
| 5,977,801 A | 11/1999 | Boerstler | |
| 6,100,736 A | 8/2000 | Wu et al. | |
| 6,265,902 B1 | 7/2001 | Klemmer et al. | |
| 6,441,691 B1 | 8/2002 | Jones et al. | |
| 6,538,475 B1 | 3/2003 | Johansen et al. | |
| 6,856,202 B2 | 2/2005 | Lesso | |
| 7,003,065 B2 | 2/2006 | Homol et al. | |
| 7,053,666 B2 * | 5/2006 | Tak et al. | 327/3 |
| 7,375,593 B2 | 5/2008 | Self | |
| 7,750,683 B2 * | 7/2010 | Huang et al. | 327/12 |
| 7,839,177 B1 * | 11/2010 | Soh | 327/3 |
| 7,940,088 B1 | 5/2011 | Sampath et al. | |
| 8,218,707 B2 | 7/2012 | Mai | |
| 2001/0052822 A1 | 12/2001 | Kim et al. | |
| 2003/0185329 A1 | 10/2003 | Dickmann | |
| 2006/0055434 A1 * | 3/2006 | Tak et al. | 327/47 |
| 2008/0265957 A1 | 10/2008 | Luong et al. | |
| 2012/0049911 A1 | 3/2012 | Ura | |

* cited by examiner

*Primary Examiner* — Long Nguyen
(74) *Attorney, Agent, or Firm* — DLA Piper LLP (US)

(57) ABSTRACT

Systems and methods associated with phase frequency detection are disclosed. In one illustrative implementation, a phase frequency detection (PFD) circuit device may comprise first circuitry and second circuitry having a set input, a reset input, and an output, wherein the set input has a higher priority than the reset input, and additional circuitry arranged and operatively coupled to provide advantageous operation of the PFD circuit device. According to some implementations, for example, systems and methods with clock edge overriding reset features, extended detection range(s), and/or reduction of reverse charge after cycle slipping are provided.

28 Claims, 8 Drawing Sheets

SYSTEMS AND METHODS OF PHASE FREQUENCY DETECTION WITH CLOCK EDGE OVERRIDING RESET, EXTENDING DETECTION RANGE, IMPROVEMENT OF CYCLE SLIPPING AND/OR OTHER FEATURES

CROSS-REFERENCE TO RELATED APPLICATION(S)

This application claims benefit/priority of provisional patent application No. 61/123,456, filed Mar. 15, 2013, which is incorporated herein by reference in entirety.

BACKGROUND

1. Field

Aspects of the present innovations relate to or involve phase frequency detection including features such as clock reset, extended detection range, reduction of reverse charge after cycle slipping and/or other features.

2. Description of Related Information

Phase-Locked Loop (PLL) is a popular circuit for locking an output clock and a reference clock in phase and frequency. For example, PLL circuitry may be used to generate an output clock with clock edge aligned to reference clock at a specific frequency ratio to the reference clock. FIG. 1 shows a typical PLL block diagram. Such PLL circuitry uses the phase-frequency-detector (PFD) 102 to detect the frequency and phase difference and a charge pump (CP) 104 for adjusting input voltage of voltage-controlled oscillator (VCO) 106 and then changing the output frequency and phase of the VCO accordingly.

FIG. 2 shows a conventional design with a PFD circuit 102 and a Charge-Pump (CP) circuit 104 connected. The PFD generates two output signals including an up pulse 202, i.e., "up" to charge up the CP output, and a down pulse 204, i.e., "dn" to discharge the CP output, in proportion to the phase difference between the reference input clock 206 (e.g. clock_ref) and the VCO output clock 208 (e.g. clock_fb). The PLL uses these "up" and "dn" output signals to lock in the phase of the reference clock and the VCO feedback clock. When there is a frequency difference between the reference clock and the VCO feedback clock, the CP output controlled by the PFD has a DC component to pull in the frequency of VCO clock for matching the frequency of reference clock.

FIG. 3 shows an ideal transfer curve of the PFD along with real transfer curves after considering the non-ideal effects in the real implementation. Non-ideal effects of a conventional implementation are shown in FIG. 4. One non-ideal effect shown on the curves of FIGS. 3 and 4 relates to a required minimum width 302, which is necessary to avoid a dead-zone. Another non-ideal effect shown in FIG. 3, at 304, includes both the minimum width 302 and a wasted time period 306, which is generated due to the round trip of "rstb" and shown by itself in FIG. 4. Non-ideal effects also include cycle slipping where, by nature, with two input clocks in different frequency, there must be cycle slipping at a certain point to re-choose clock edge for comparison. Furthermore, after cycle slipping, the output of PFD+CP can be reversed.

BRIEF DESCRIPTION OF THE DRAWINGS

The accompanying drawings, which constitute a part of this specification, illustrate various implementations and aspects of the innovations herein and, together with the description, help illustrate aspects of the present innovations. In the drawings.

DETAILED DESCRIPTION OF ILLUSTRATIVE IMPLEMENTATIONS

Reference will now be made in detail to the innovations herein, examples of which are illustrated in the accompanying drawings. The implementations set forth in the following description do not represent all implementations consistent with the present inventions. Instead, they are merely some examples consistent with certain aspects related to the present innovations. Wherever possible, the same reference numbers will be used throughout the drawings to refer to the same or like parts.

Figure 1:
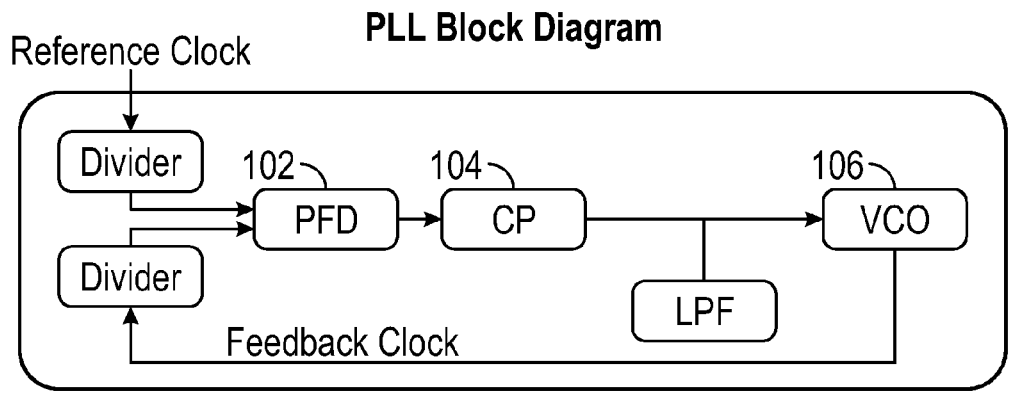
FIG. 1 is a block diagram of a conventional Phase-Locked Loop circuit.
Figure 2:
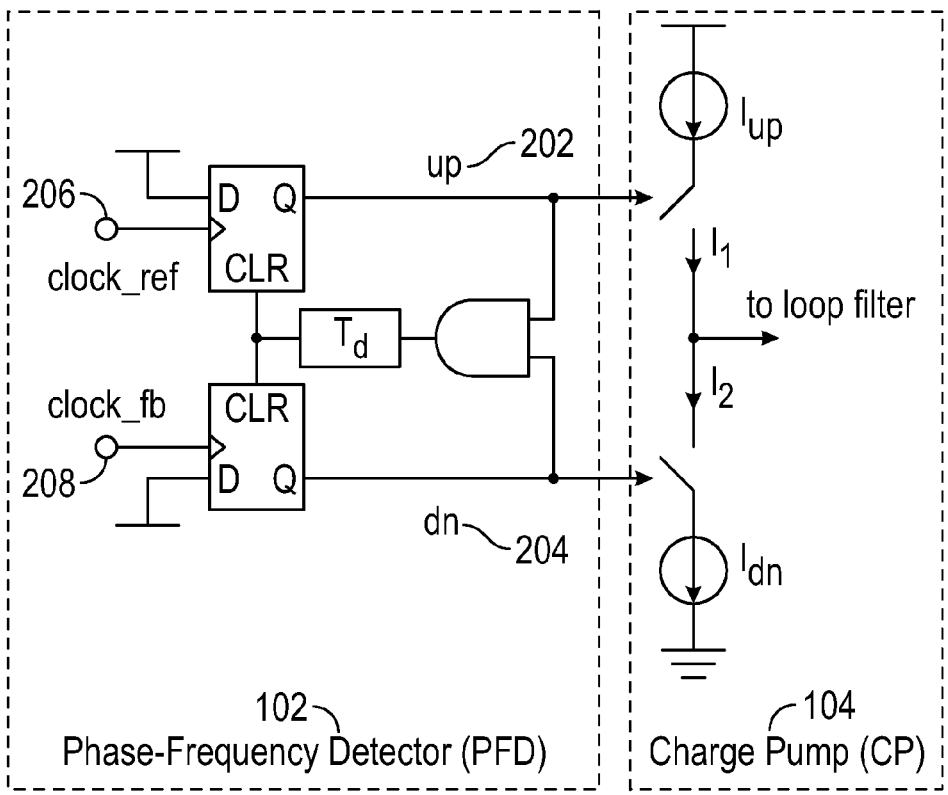
FIG. 2 is a block diagram of a conventional Phase-Frequency Detector with Charge Pump.
Figure 3:
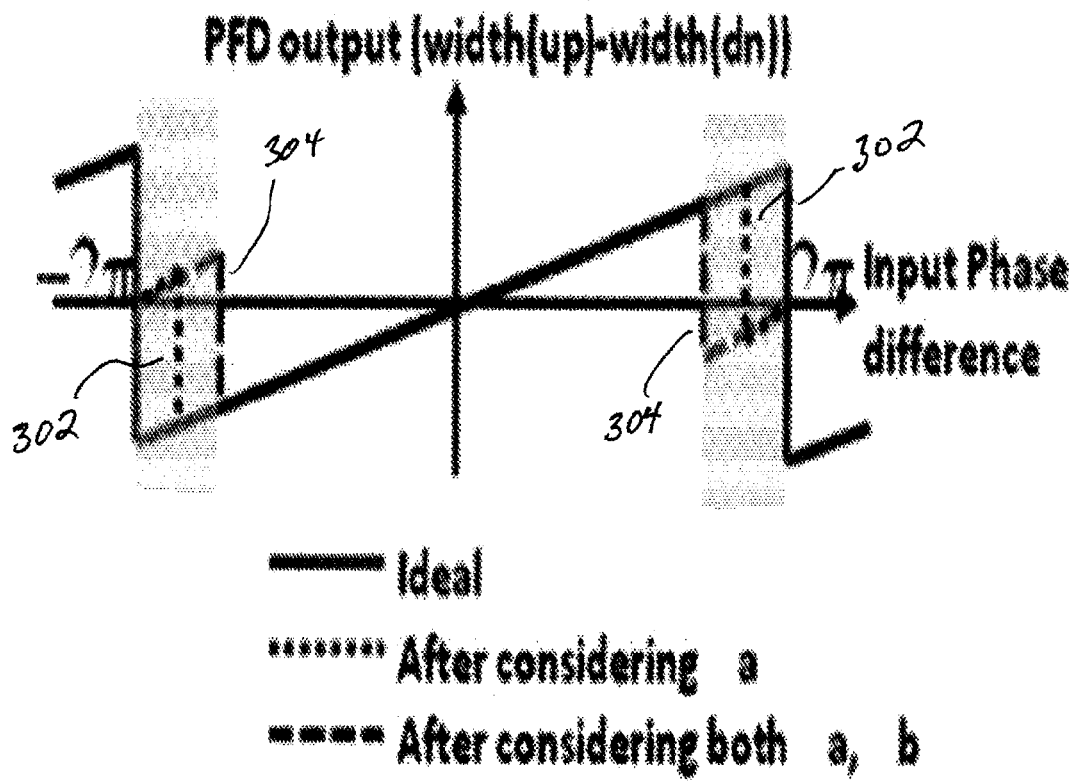
FIG. 3 is an ideal transfer curve of a conventional Phase-Frequency Detector.
Figure 4:
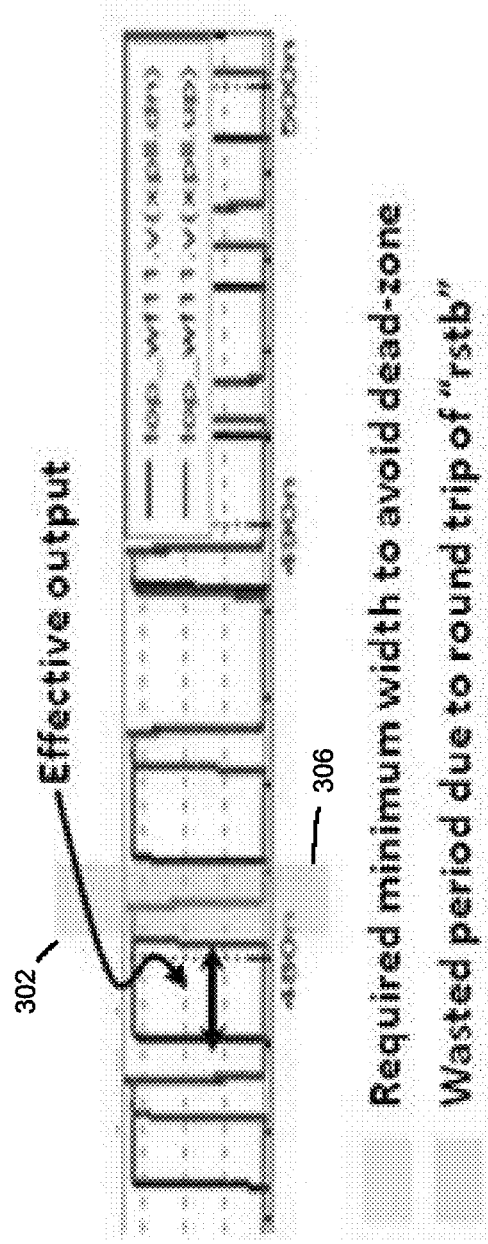
FIG. 4 is a timing diagram of non-ideal effects of a conventional Phase-Frequency Detector.
Figure 5:
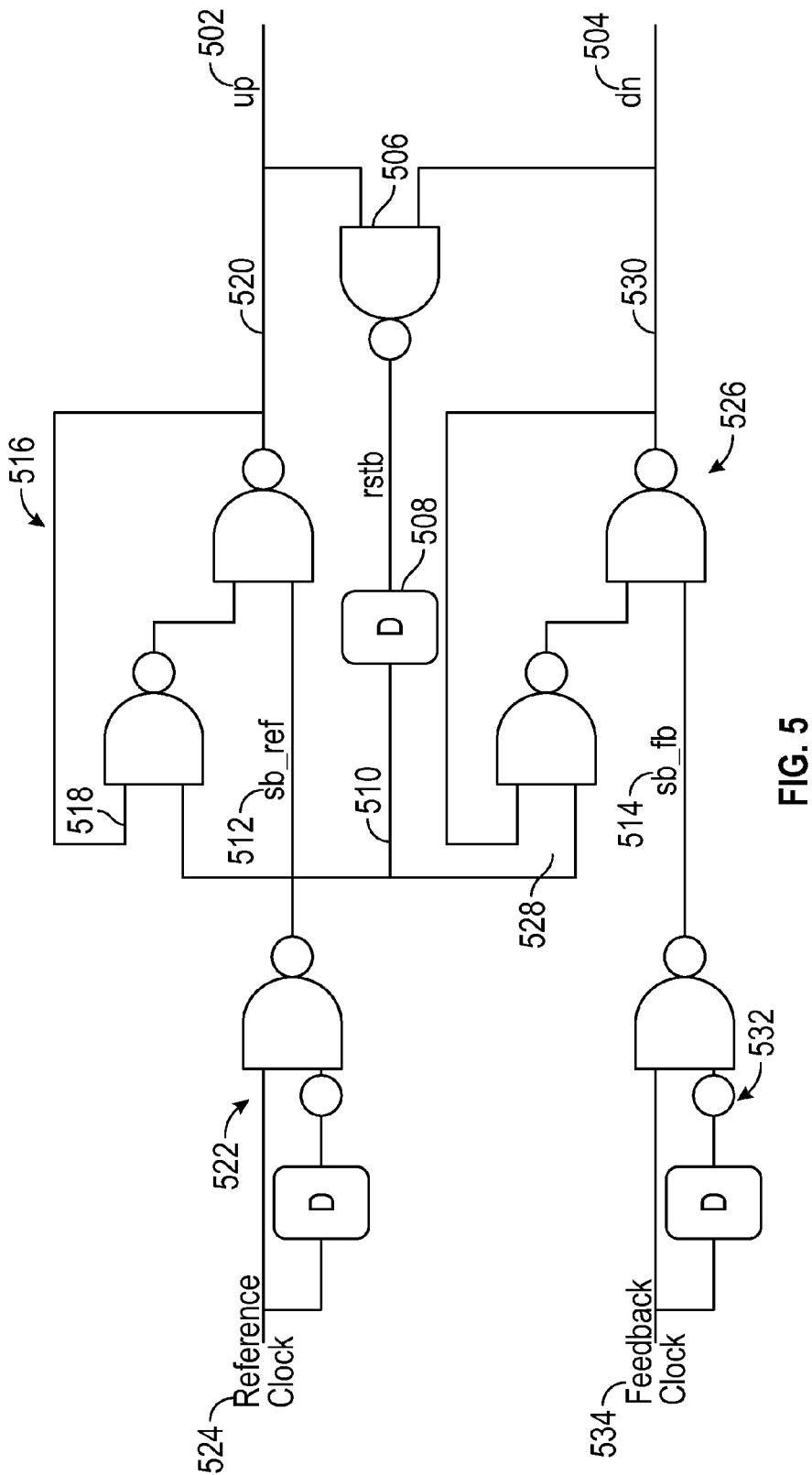
FIG. 5 is a block diagram of an illustrative Phase-Frequency Detector consistent with one or more aspects of the innovations herein.
Figure 9:
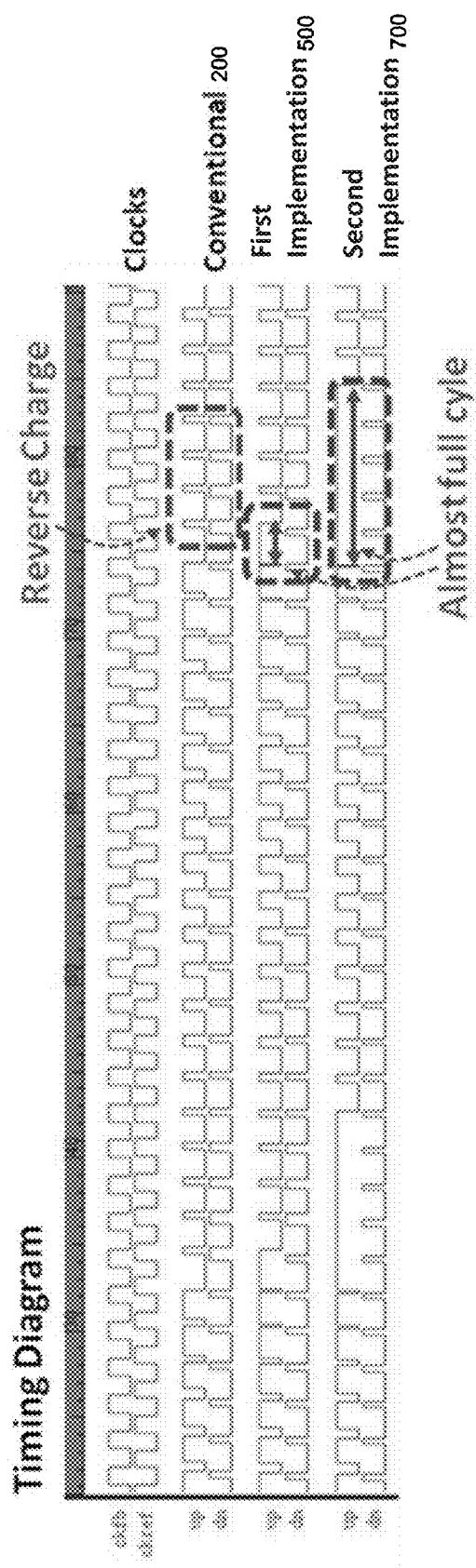
FIG. 9 is a timing diagram of an illustrative Phase-Frequency Detector consistent with one or more aspects of the innovations herein.
Figure 10:
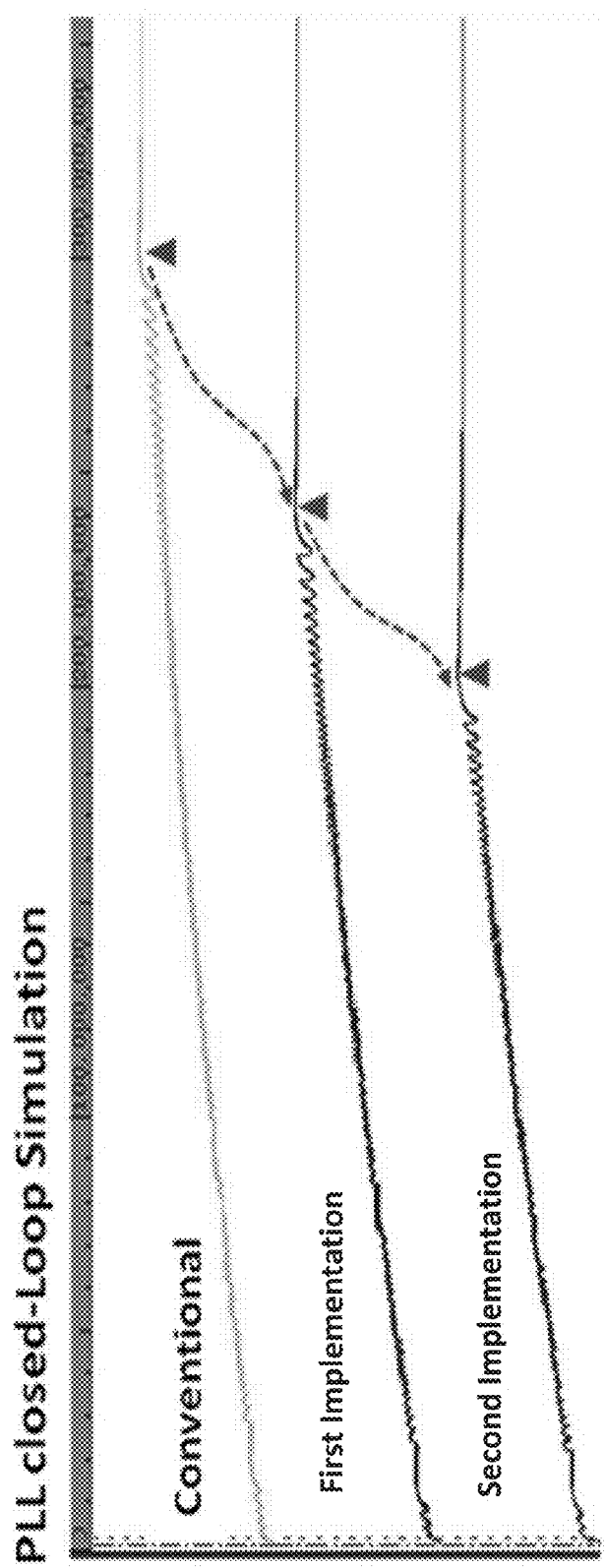
FIG. 10 is a PLL closed loop simulation consistent with one or more aspects of the innovations herein.

A first implementation consistent with systems and methods herein is illustrated in the block diagram of FIG. 5 and corresponding timing diagram in FIG. 9. In a conventional PFD design, "rstb" overrides clock edges and resets "up", "dn". However, according to the innovative configurations of FIG. 5 and elsewhere herein, the circuit provides for clock edge override of "rstb".

In overview, pulses are generated on the clock rising edges. These pulses are used to set "up", "dn" signals, 502 and 504. Via logical "And" 506, the "up", and "dn" signals may reset these pulses with a delay (D) 508 to guarantee the minimum "up", "dn" pulse-width required for the Charge-Pump circuit. The reset signal (rstb) 510 may reset both "up", "dn" as long as "sb_ref" 512, "sb_fb" 514 is/are not asserted at the moment. If either "sb_ref" or "sb_fb" is asserted when "rstb" is also asserted, then the reset operation by the "rstb" will be ignored. As such, the clock edge represented by either "sb_ref" or "sb_fb" is detected and is effective in setting the "up", "dn" signals In some implementations, a PFD state machine (represented by Flip-Flops) may change states via clock edges of the reference clock and the feedback clock or by self-reset signal generated by its own output states. Clock edges and self-reset signal are asynchronous signals. If they occur at the same time, one of them may be given higher priority. In the embodiments described herein, priority may be given to clock edges instead of self-reset.

The block diagram of FIG. 5 illustrates a phase frequency detector circuit including a first SR flip flop circuit 516 having a set input 512, a reset input 518, and an output 520. A first one shot circuit 522 is coupled between the reference clock signal 524 and the set input 512 of the first SR flip flop. A second SR flip flop circuit 526 is provided having a set input 514, a reset input 528, and an output 530. A second one shot circuit 532 is coupled between the feedback clock signal 534 and the set input 514 of the second SR flip flop 526. Self-reset circuitry may be provided (e.g., circuitry such as 506 and 508, and associated connection/configuration) that triggers a reset signal to the reset of the SR flip flops. The reset circuitry activates the reset signal when both outputs are high. A reset signal is coupled to the reset inputs of the first flip flop and the second flip flop. As a function of the set inputs having a higher priority than the reset inputs, the reset signal may have a reduced chance to affect the detection of the clock edges. Furthermore, the clock edges of the incoming reference and feedback clock signals are used as level-triggered signals and the reset signal is use as a level-triggered signal.

As such, consistent with FIG. 5, a phase frequency detector (PFD) circuit device may comprise first circuitry including a first flip flop circuit comprising a set input, a reset input, and an output, wherein the set input has a higher priority than the reset input, second circuitry including a second flip flop comprising a set input, a reset input, and an output, wherein the set input has a higher priority than the reset input, and self-reset circuitry comprising an output coupled to the reset input of the first flip flop and the reset input of the second flip flop, the self-reset circuitry arranged and operatively coupled to generate a reset signal at the output when the output of the first flip flop circuit and the output of the second flip flop circuit are both high. Accordingly, as a function of the set inputs having a higher priority than the reset inputs, the reset signal may have a reduced chance to affect the detection of the clock edges. Additionally, according to further implementations herein, the circuitry may be arranged and connected to provide clock edge overriding reset, extended detection range, and/or reduction of reverse charge after cycle slipping.

Figure 6:
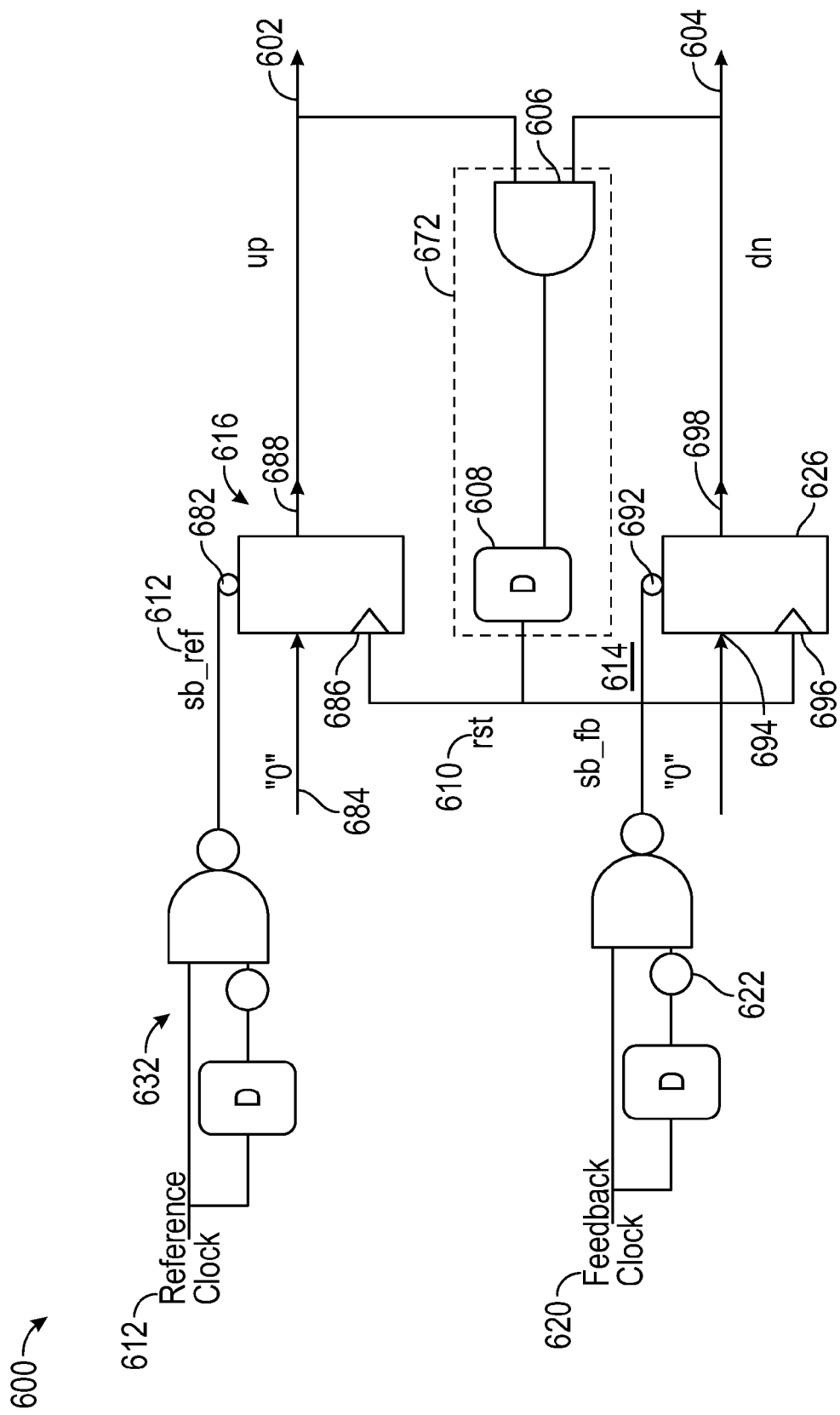
FIG. 6 is a block diagram of an illustrative Phase-Frequency Detector consistent with one or more aspects of the innovations herein.

A second implementation is illustrated in the block diagram of FIG. 6 and corresponding timing diagram in FIG. 9. Similar to FIG. 5, clock edge information may be utilized to override "rstb" in the illustrative circuitry of FIG. 6. Further, beyond such override feature, the "rstb" may be utilized as an edge-triggered event. Here, for example, the "rstb" may change the state of the flip-flop only at its rising edge, such that the clock edge(s) may change the state at any other time. This circuitry, configuration, and operation may extend the detection range of the PFD.

Also in the illustrative implementation of FIG. 6, pulses are generated on the clock rising edges. These pulses are used to set the "up", "dn" signals, 602 and 604. Again, via the illustrative logical "And" 606 etc. aspects, the "up", and "dn" signals to reset themselves with a delay 606 (e.g. D) to guarantee minimum "up", "dn" pulsewidth required for the Charge-Pump circuit. This reset signal 610 (rst) resets "up", "dn" at the rising edge of "rst" as long as "sb_ref", "sb_fb" is not asserted at the moment. If either "sb_ref" 612 or "sb_fb" 614 is asserted at rising edge of "rst", the reset operation by the "rst" will be ignored. As such, the clock edge represented by either "sb_ref" or "sb_fb" is detected and is effective in setting "up", "dn" signals.

Further, consistent with such second implementations, clock edges may be utilized as level-triggered signals while the self-reset may be utilized as an edge-triggered signal. Such circuitry and aspects, here, may also be connected and operated in a manner that the clock edge has a higher priority than does the self-reset.

Figure 7:
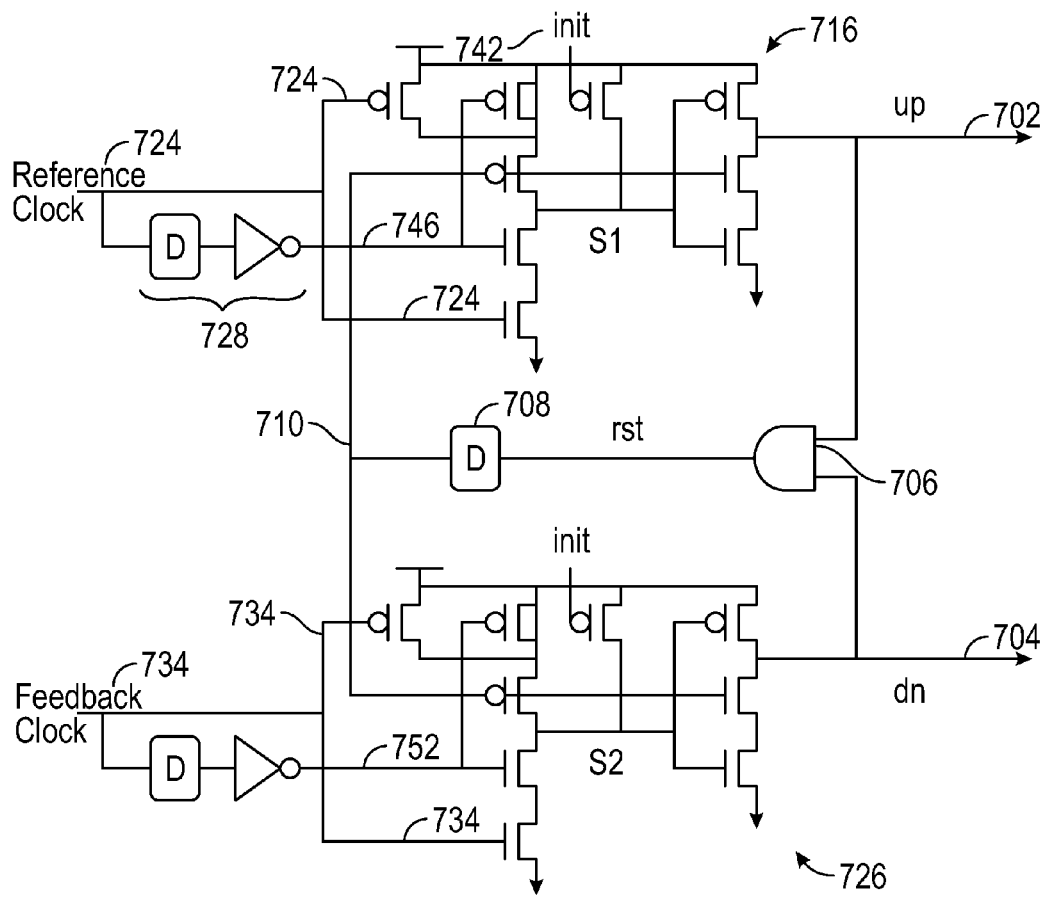
FIG. 7 is a block diagram of an illustrative Phase-Frequency Detector consistent with one or more aspects of the innovations herein.

FIG. 7 is a block diagram illustrating yet a further implementation, bearing some relation to the innovations of FIG. 6, and involving dynamic logic. In the illustrative circuitry shown in FIG. 7, initialization circuitry is used to avoid dead lock in dynamic logic implementation. Initially, output states up, dn may be in logic "0". At rising edge of reference clock, 724, delay and inverting circuit 728 may keep node 746 high so both NMOS 746 and NMOS 724 are on, which pushes node "S1" to low, then node "up" is pulled up by circuit 716. After a short duration defined by delay element 728, node 746 is pushed down and no longer affects node "S1", so the state of "S1" is kept until a next action by the dynamic logic circuit. The feedback clock path may operate substantially the same way. At rising edge of feedback clock, 734, delay and inverting circuit 738 keeps node 752 high so both NMOS 752 and NMOS 734 are on, which pushes node "S2" to low, then node "dn" is pulled up by circuit 726. After a short duration defined by delay element 738, node 752 is pushed down and no longer affects node "S2", so the state of "S2" is kept until next action by the dynamic logic circuit. After both "up" and "dn" signals are high, an AND gate 706 may generate signal "rst" to reset "up", "dn" to logic "0". The output state goes back to initial state and continues cycle of this operation. As such, the operation bears relation to FIG. 6, though with simplified dynamic logic circuitry. Further, in some implementations, the self-reset signal is latched by both clocks. In normal PFD operation, the two latched signals cannot stay active for a long time at the same time. In operation, if noise or other issues cause dead lock, the two latched signals become active at the same time, which can occur frequently. However, circuitry and innovations consistent with FIG. 7 may generate an init_n signal to re-initialize the PFD in this event.

Figure 8:
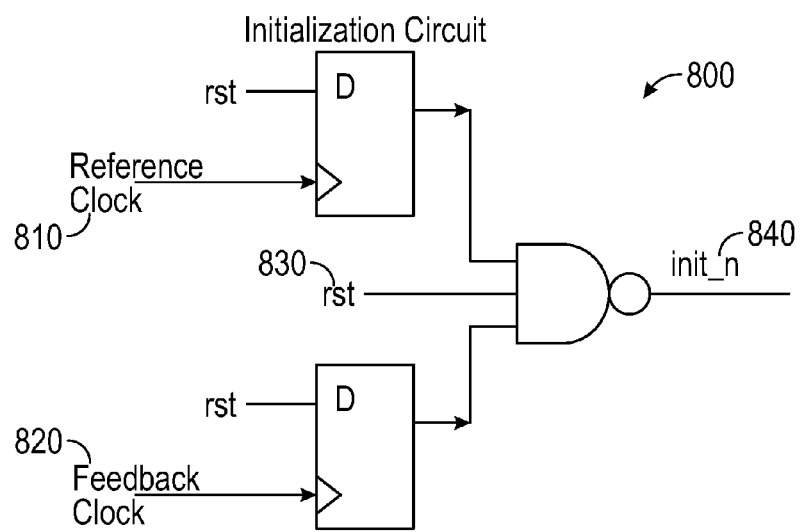
FIG. 8 is a block diagram of an illustrative initialization circuit of an illustrative Phase-Frequency Detector consistent with one or more aspects of the innovations herein.

A re-initialization circuit 800, such as one that may be utilized in connection with the innovations of FIG. 6, is illustrated in FIG. 8. During operation of circuitry such as that of FIG. 6, if both "up" and "dn" signals are at state "1" at the beginning and both nodes s1 and s2 are at state "0", then this circuit may be stuck in an incorrect state. Therefore, nodes s1 and s2 are set to state "1" before the PFD starts operation by "init_n" signal. After the initialization, at the beginning, the circuit may typically operate normally. However, in the case of a noisy environment where the circuit gets stuck in the aforementioned incorrect state, the re-initialization circuit 800 shown in FIG. 8 can recover the circuit back to normal operation.

Referring to FIG. 8, during normal operation, the rst signal is at state "1" when clock edges at both the reference clock 810 and the feedback clock 820 have occurred. As such, the rst signal 830 should rise right after the second clock edge occurs. Consequently, if the rst signal 830 is latched by the two clocks, one of the latched data should be at state "0" (latched before the "rst" signal 830 rises). However, if the circuit gets stuck, both latched data are at state "1". This condition may be used to generate an initialization signal (init_n 840 in FIG. 8) to re-initiate the operation.

The second implementation may be described as providing a phase frequency detector circuit 600 including a first flip flop circuit 616 having a D (data) input 684, a clock input 686, and a set input 682 coupled to a reference clock signal 612. A first one shot circuit 632 is coupled between the reference clock signal 612 and the set input 682. A second flip flop circuit 626 includes a D (data) input 694, a clock input 696, and a set input 692 coupled to a feedback clock signal 620, and a Q output 698. A second one shot circuit 622 is coupled between the feedback clock signal 620 and the set input 692. A self-reset circuit 672 triggers a reset signal 610 to the clock inputs 686, 696 of the flip flops 616, 626. The reset circuit 672 activates the reset signal 610 when both Q outputs 688, 698 are high. The reset signal 610 is coupled to the clock inputs 686, 696 of the first flip flop 616 and the second flip flop 626. The data inputs 684, 694 of the first flip flop 616 and the second flip flop 626 are coupled to a low/zero signal. The clock edges of the incoming reference clock signal 612 and feedback clock signal 620 are used as level-triggered signals while the self-reset signal 610 is used as an edge-triggered signal.

When the clock edge has a higher priority than the reset signal 610, the reset signal 610 may have a reduced chance to affect the detection of the clock edges. In some implementations, the reset circuitry 672 may include an AND gate 606 coupled to the Q outputs 688, 698 to produce a high reset signal. However, other circuitry may be utilized to produce the logic and features set forth herein.

In addition to the illustrative innovations and architecture described above, the present inventions may also include, inter alia, methods of memory operation, methods of fabricating memory devices consistent with the features and/or functionality herein, products, and products produced via such processes. By way of example and not limitation, methods of memory fabrication herein may include known RAM manufacturing processes such as in CMOS technologies involving aspects such as p-mos and n-mos transistor formation, multiple metallization layers and/or local interconnects, among others.

As disclosed herein, features consistent with the present inventions may be utilized via and/or involved with computer hardware, software and/or firmware. For example, the systems and methods disclosed herein may be embodied in or used in connection with various forms including, for example, memory, data processors, such as in computing devices that also includes memory, a database, digital electronic circuitry, firmware, software, or in combinations of such forms. Further, while some of the disclosed implementations describe specific hardware components, systems and methods consistent with the innovations herein may be implemented in the context of any combination of hardware, software and/or firmware. Moreover, the above-noted features and other aspects and principles of the innovations herein may be implemented in various memory environments. Such environments and related applications may be specially constructed for performing the various routines, processes and/or operations associated with the innovations or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with innovations herein, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data/instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media), though does not include transitory media such as carrier waves.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the inventions have been specifically described herein, it will be apparent to those skilled in the art to which the inventions pertain that variations and modifications of the various implementations shown and described herein may be made without departing from the spirit and scope of the innovations herein. Accordingly, it is intended that the inventions be limited only to the extent required by the applicable rules of law.

The invention claimed is:

1. A phase frequency detector (PFD) circuit device comprising:

first dynamic logic circuitry comprising a reference clock input receiving a reference clock signal, a delayed reference clock input, a reset input, and an output controlled by a rising clock edge of the reference clock signal and the reset input;

second dynamic logic circuitry comprising a feedback clock input receiving a feedback clock signal, a delayed feedback clock input, a reset input, and an output controlled by a rising clock edge of the feedback clock signal and the reset input; and self-reset circuitry comprising an output coupled to the reset input of the first dynamic logic circuitry and the reset input of the second dynamic logic circuitry, the self-reset circuitry arranged and connected to generate a reset signal at the output of the self-reset circuitry when the output of the first dynamic logic circuitry and the output of the second dynamic logic circuitry are both high; and each of the first and second dynamic logic circuitry has one or more transistors triggered by the respective of the rising clock edge of the reference clock signal and the feedback clock signal that prevent the reset signal from affecting the outputs of the first and second dynamic logic circuitry so that clock edge detection by the first and second dynamic logic circuitry is not prevented by the reset signal.

2. The circuit device of claim 1, wherein the first dynamic logic circuitry further comprises first one shot circuitry comprising an input coupled to a reference clock signal and an output coupled to the set input of the first dynamic logic circuitry.

3. The circuit device of claim 1, wherein the second dynamic logic circuitry further comprises second one shot circuitry comprising an input coupled to the feedback clock signal and an output coupled to the set input of the second dynamic logic circuitry.

4. The circuit device of claim 1 wherein, as a function of the set inputs having a higher priority than the reset inputs, the reset signal does not affect a detection of a clock edge of the reference clock signal input to the first dynamic logic circuitry or of a clock edge of the feedback clock signal input to the second dynamic logic circuitry.

5. The circuit device of claim 1, wherein:
a clock edge of the reference clock signal input to the first dynamic logic circuitry is a level-triggered signal;
a clock edge of the feedback clock signal input to the second dynamic logic circuitry is a level-triggered signal; and
the reset signal is an edge-triggered signal.

6. The circuit device of claim 1, wherein:
the first dynamic logic circuitry further comprises an initialization input; and
the second dynamic logic circuitry further comprises an initialization input.

7. The circuit device of claim 6, further comprising an initialization circuit comprising:
an output coupled to the initialization input of the first dynamic logic circuitry and to the initialization input of the second dynamic logic circuitry; and
an input coupled to the output of the first dynamic logic circuitry and to the output of the second dynamic logic circuitry; wherein
the initialization circuitry is arranged and connected to generate an initialization signal at the output of the initialization circuitry when the output of the first dynamic logic circuitry and the output of the second dynamic logic circuitry are both high at the same time.

8. The circuit device of claim 6 wherein, as a function of the set inputs having a higher priority than the reset inputs, the reset signal does not affect a detection of a clock edge of the reference clock signal input to the first dynamic logic circuitry or of a clock edge of the feedback clock signal input to the second dynamic logic circuitry.

9. The circuit device of claim 6, wherein:
a clock edge of the reference clock signal input to the first dynamic logic circuitry is a level-triggered signal;
a clock edge of the feedback clock signal input to the second dynamic logic circuitry is a level-triggered signal; and
the reset signal is a level-triggered signal.

10. Phase frequency detector (PFD) circuitry comprising:
first dynamic logic circuitry comprising a reference clock input receiving a reference clock signal, a delayed clock input, a reset input and an output controlled by a rising clock edge of the reference clock signal and the reset input;
a second dynamic logic circuitry comprising a feedback clock input, a delayed feedback clock input receiving a feedback clock signal, a reset input and an output controlled by a rising clock edge of the feedback clock signal and the reset input; and
a self-reset circuitry comprising an output coupled to the reset input of the first dynamic logic circuitry and the reset input of the second dynamic logic circuitry, the self-reset circuitry arranged and connected to generate a reset signal at the output of the self-reset circuitry when the output of the first dynamic logic circuitry and the output of the second dynamic logic circuitry are both high; and
each of the first and second dynamic logic circuitry having one or more transistors triggered by the respective of the rising clock edge of the reference clock signal and the feedback clock signal that prevent the reset signal from affecting the outputs of the first and second dynamic logic circuitry so that clock edge detection by the first and second dynamic logic circuitry is not prevented by the reset signal.

11. The circuitry of claim 10, wherein the first dynamic logic circuitry further comprises first one shot circuitry comprising an input coupled to the reference clock signal and an output coupled to the set input of the first dynamic logic circuitry.

12. The circuitry of claim 10, wherein the second dynamic logic circuitry further comprises second one shot circuitry comprising an input coupled to the feedback clock signal and an output coupled to the set input of the second dynamic logic circuitry.

13. The circuitry of claim 10, wherein:
a clock edge of the reference clock signal input to the first dynamic logic circuitry is a level-triggered signal;
a clock edge of the feedback clock signal input to the second dynamic logic circuitry is a level-triggered signal; and
the reset signal is an edge-triggered signal.

14. The circuitry of claim 10 wherein:
the first dynamic logic circuitry further comprises an initialization input; and
the second dynamic logic circuitry further comprises an initialization input.

15. The circuitry of claim 14 further comprising an initialization circuit comprising:
an output coupled to the initialization input of the first dynamic logic circuitry and to the initialization input of the second dynamic logic circuitry; and
an input coupled to the output of the first dynamic logic circuitry and to the output of the second dynamic logic circuitry; wherein
the initialization circuitry is arranged and connected to generate an initialization signal at the output of the initialization circuitry when the output of the first dynamic logic circuitry and the output of the second dynamic logic circuitry are both high at the same time.

16. A method for operating phase frequency detector circuitry, the method comprising:
coupling an output of reset circuitry to a reset input of first dynamic logic circuitry and a reset input of second dynamic logic circuitry, wherein the first dynamic logic circuitry comprises a reference clock input receiving a reference clock signal, a delayed reference clock input, the reset input, and an output controlled by a rising clock edge of the reference clock signal and the reset input, and wherein the second dynamic logic circuitry comprises a feedback clock input receiving a feedback clock signal, a delayed feedback clock input, the reset input, and an output controlled by a rising clock edge of the feedback clock signal and the reset input;

generating a reset signal at the output of the reset circuitry when the output of the first dynamic logic circuitry and the output of the second dynamic logic circuitry are both high; and preventing the reset signal from affecting the outputs of the first and second dynamic logic circuitry so that no clock edge is missed by the first and second dynamic logic circuitry.

17. The method of claim 16, further comprising:
coupling an input of first one shot circuitry associated with the first dynamic logic circuitry to the reference clock signal, and coupling an output of the first one shot circuitry to the set input of the first dynamic logic circuitry.

18. The method of claim 16, further comprising:
coupling an input of second one shot circuitry associated with the second dynamic logic circuitry to the feedback clock signal, and coupling an output of the second one shot circuitry to the set input of the second dynamic logic circuitry.

19. The method of claim 16 wherein, as a function of the set inputs having a higher priority than the reset inputs, the reset signal does not affect a detection of a clock edge of the reference clock signal input to the first dynamic logic circuitry or of a clock edge of the feedback clock signal input to the second dynamic logic circuitry.

20. The method of claim 16, further comprising:
inputting a clock edge of a level-triggered signal as the reference clock signal to the first dynamic logic circuitry;
inputting a level-triggered signal clock edge as the feedback clock signal to the second dynamic logic circuitry; and
inputting an edge-triggered signal as the reset signal.

21. The method of claim 16, further comprising:
providing a first initialization input to the first dynamic logic circuitry; and
providing a second initialization input to the second dynamic logic circuitry.

22. The method of claim 21, further comprising:
initializing the first and second dynamic logic circuitry via an initialization circuit that includes:
an output coupled to the initialization input of the first dynamic logic circuitry and to the initialization input of the dynamic logic circuitry; and
an input coupled to the output of the first dynamic logic circuitry and to the output of the second dynamic logic circuitry;
wherein the initialization circuitry is arranged and connected to generate an initialization signal at the output of the initialization circuit when the output of the first dynamic logic circuitry and the output of the second dynamic logic circuitry are both high at the same time.

23. The method of claim 21 wherein, as a function of the set inputs having a higher priority than the reset inputs, the reset signal does not affect a detection of a clock edge of the reference clock signal input to the first dynamic logic circuitry or of a clock edge of the feedback clock signal input to the second dynamic logic circuitry.

24. The method of claim 21, further comprising:
inputting a clock edge of a level-triggered signal as the reference clock signal to the first dynamic logic circuitry;
inputting a level-triggered signal clock edge as the feedback clock signal to the second dynamic logic circuitry; and
inputting a level-triggered signal as the reset signal.

25. Phase frequency detector (PFD) circuitry comprising:
first dynamic logic circuitry comprising a reference clock input, a delayed reference clock input receiving a reference clock signal, a set input, a reset input, an initialization input, an output controlled by a rising clock edge of the reference clock signal and the reset input, and first one shot circuitry comprising an input coupled to the reference clock signal and an output coupled to the set input of the first dynamic logic circuitry;
second dynamic logic circuitry comprising a feedback clock input receiving a feedback clock signal, a delayed feedback clock input, a set input, a reset input, an initialization input, an output controlled by a rising clock edge of the feedback clock signal and the reset input, and second one shot circuitry comprising an input coupled to the feedback clock signal and an output coupled to the set input of the second dynamic logic circuitry;
self-reset circuitry comprising an output coupled to the reset input of the first dynamic logic circuitry and the reset input of the second dynamic logic circuitry, the self-reset circuitry arranged and connected to generate a reset signal at the output of the self-reset circuitry when the output of the first dynamic logic circuitry and the output of the second dynamic logic circuitry are both high;
initialization circuitry coupled to the first and second dynamic logic circuitry; and
each of the first and second dynamic logic circuitry has circuits triggered by the respective of the rising clock edge of the reference clock signal and the feedback clock signal to prevent the reset signal from affecting the outputs of the first and second dynamic logic circuitry so that no clock edge is missed due to the reset signal.

26. The PFD circuitry of claim 25 wherein the initialization circuitry comprises:
an output coupled to the initialization input of the first dynamic logic circuitry and to the initialization input of the second dynamic logic circuitry; and
an input coupled to the output of the first dynamic logic circuitry and to the output of the second dynamic logic circuitry; wherein
the initialization circuitry is constructed and arranged to generate an initialization signal at the output of the initialization circuitry when the output of the first dynamic logic circuitry and the output of the second dynamic logic circuitry are both high at the same time.

27. The PFD circuitry of claim 25 wherein, as a function of the set inputs having a higher priority than the reset inputs, the reset signal does not affect a detection of a clock edge of the reference clock signal input to the first dynamic logic circuitry or of a clock edge of the feedback clock signal input to the second dynamic logic circuitry.

28. The PFD circuitry of claim 25 wherein:
a clock edge of the reference clock signal input to the first dynamic logic circuitry is a level-triggered signal;
a clock edge of the feedback clock signal input to the second dynamic logic circuitry is a level-triggered signal; and
the reset signal is an edge-triggered signal.

* * * * *